United States Patent [19]

Isobe et al.

[11] Patent Number: 5,206,830

[45] Date of Patent: * Apr. 27, 1993

[54] REFRESH CONTROL CIRCUIT OF PSEUDO STATIC RANDOM ACCESS MEMORY AND PSEUDO STATIC RANDOM ACCESS MEMORY APPARATUS

[75] Inventors: Mitsuo Isobe, Tama; Hisashi Ueno, Kawasaki, both of Japan

[73] Assignee: Kabushiki Kaisha Toshiba, Kawasaki, Japan

[*] Notice: The portion of the term of this patent subsequent to Dec. 24, 2008 has been disclaimed.

[21] Appl. No.: 733,126

[22] Filed: Jul. 19, 1991

Related U.S. Application Data

[63] Continuation of Ser. No. 375,856, Jul. 6, 1989, Pat. No. 5,075,886.

[30] Foreign Application Priority Data

Jul. 6, 1988 [JP] Japan .................................. 63-168186

[51] Int. Cl.⁵ .............................................. G11C 7/00
[52] U.S. Cl. ...................................... 365/194; 365/222; 365/233; 307/592; 307/596; 307/602; 307/606
[58] Field of Search ........................ 365/194, 222, 233; 307/592, 596, 601, 602, 606

[56] References Cited

U.S. PATENT DOCUMENTS

| | | | |
|---|---|---|---|
| 4,578,782 | 3/1986 | Kraft et al. | 365/222 |
| 4,809,233 | 2/1989 | Takemae | 365/222 |
| 4,837,466 | 6/1989 | Kanauchi | 307/605 |
| 5,075,886 | 12/1991 | Isobe et al. | 365/194 |

Primary Examiner—Joseph E. Clawson, Jr.
Attorney, Agent, or Firm—Foley & Lardner

[57] ABSTRACT

A refresh control circuit for a pseudo static random access memory includes a refresh control signal output circuit for outputting a refresh control signal to accomplish refresh control of the pseudo static random access memory, and includes a delay circuit. A first chip enable signal from a control device such as a MPU is delayed by the delay circuit and outputted as a second chip enable signal for the PSRAM. As the first chip enable signal level changes from a selection level to a non-selection level, the refresh control signal level changes to a non-refresh level. This state is maintained for a predetermined period. After the second chip enable signal changes from the selection level to the non-selection level, the refresh control signal returns from the non-refresh level to the refresh level. Thus, the PSRAM enters into the refresh state during the non-selection state, and is refreshed. This refresh operation is necessarily performed after an access to PSRAM.

10 Claims, 5 Drawing Sheets

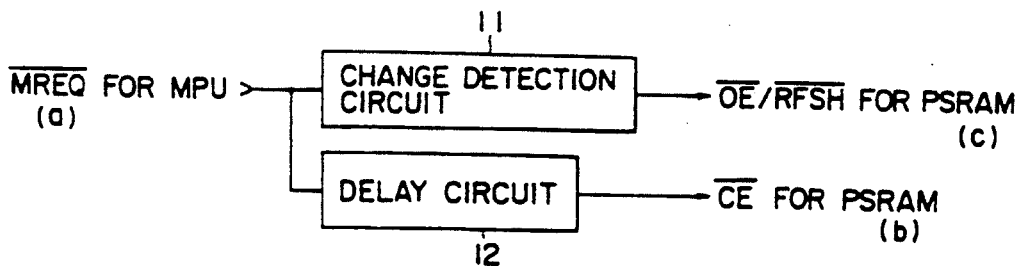
F I G. 1
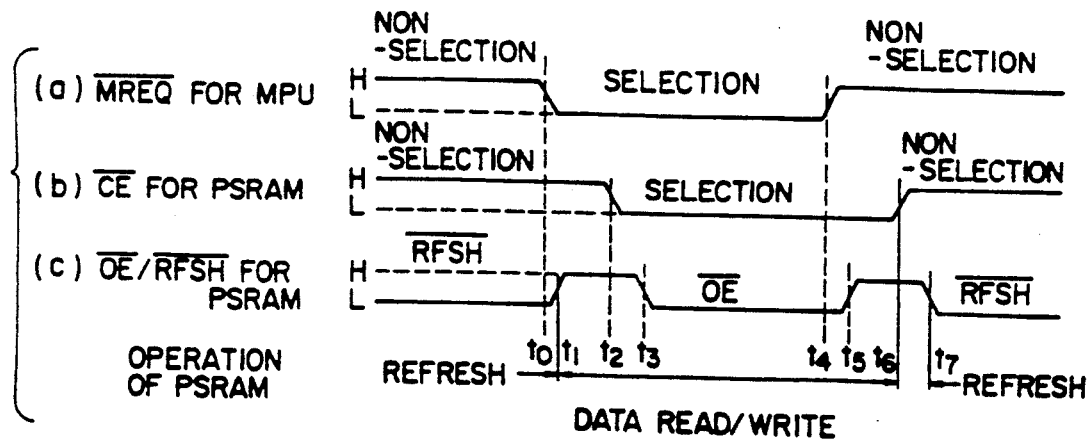
F I G. 2
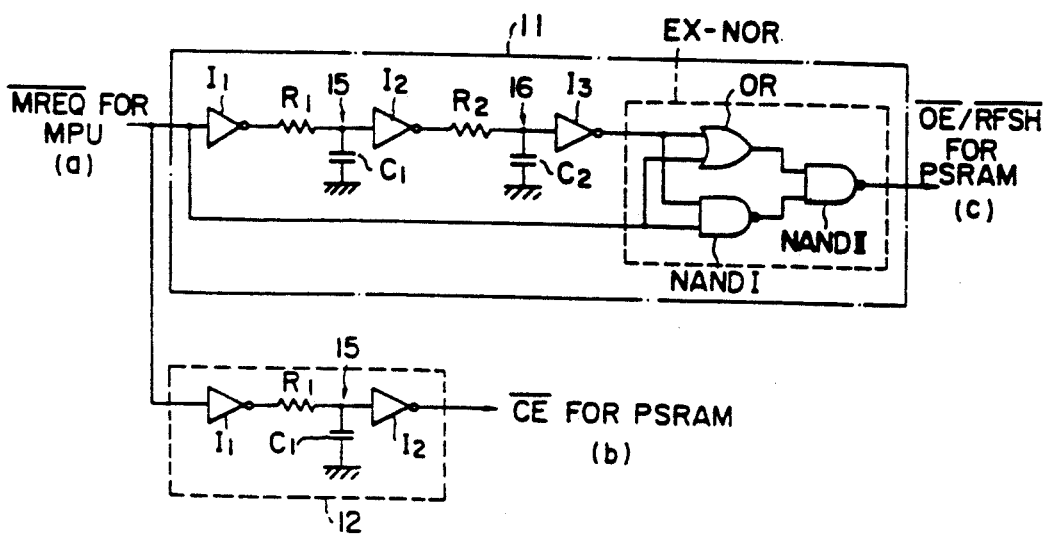
F I G. 3

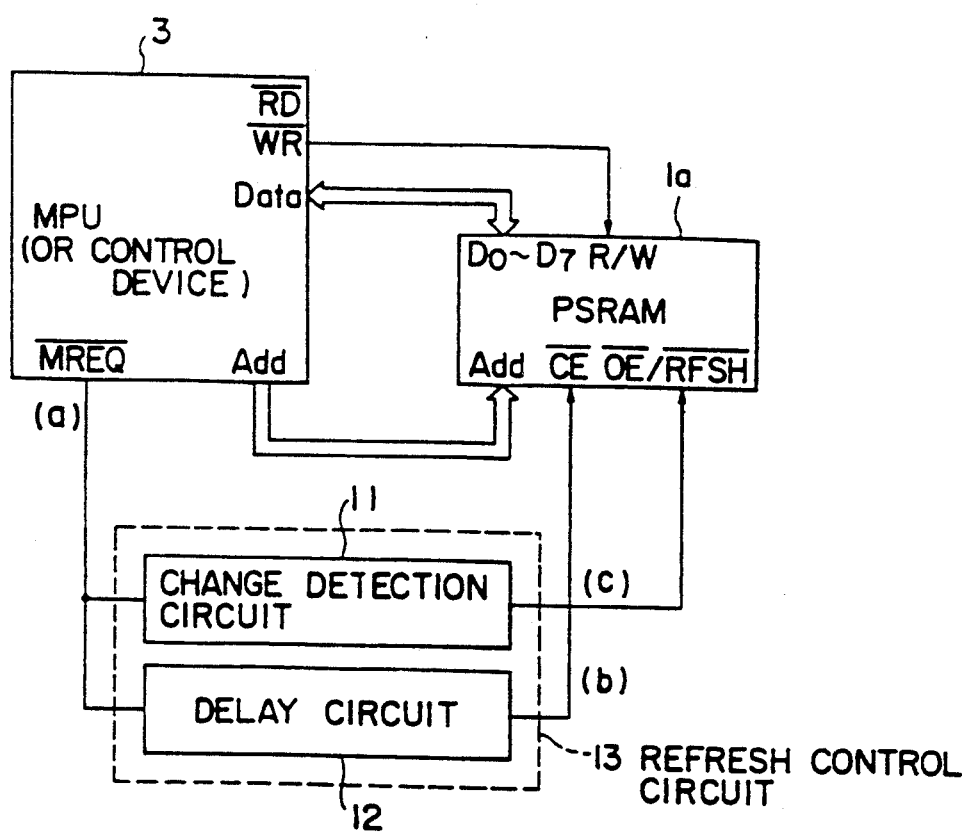
F I G. 6
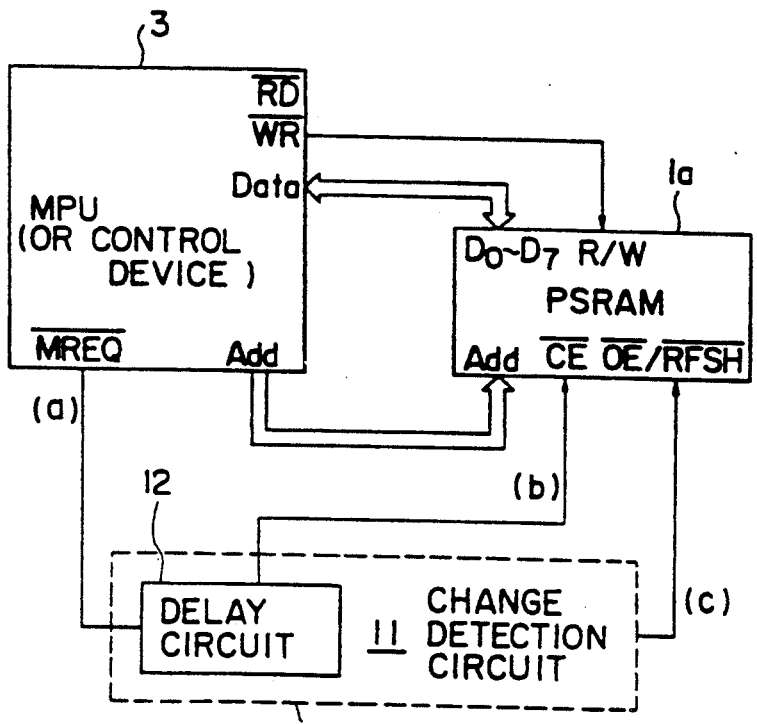
F I G 6A

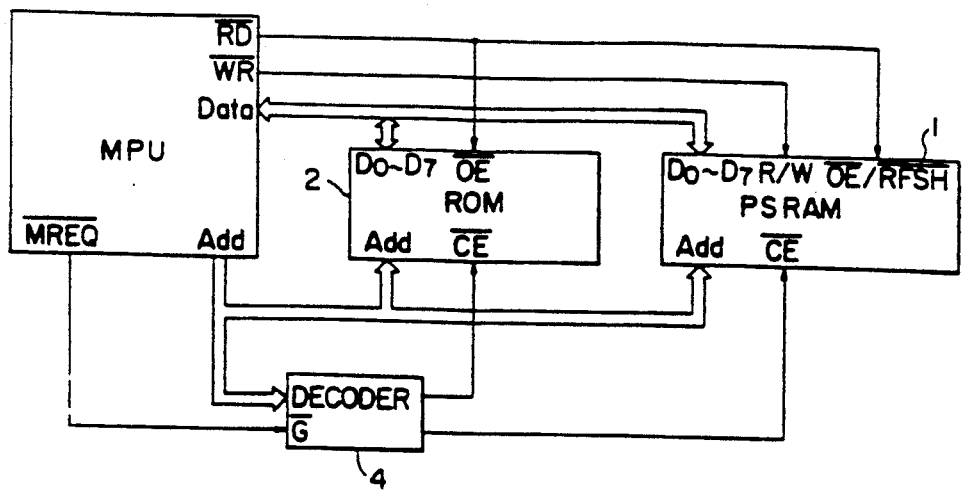
F I G. 8
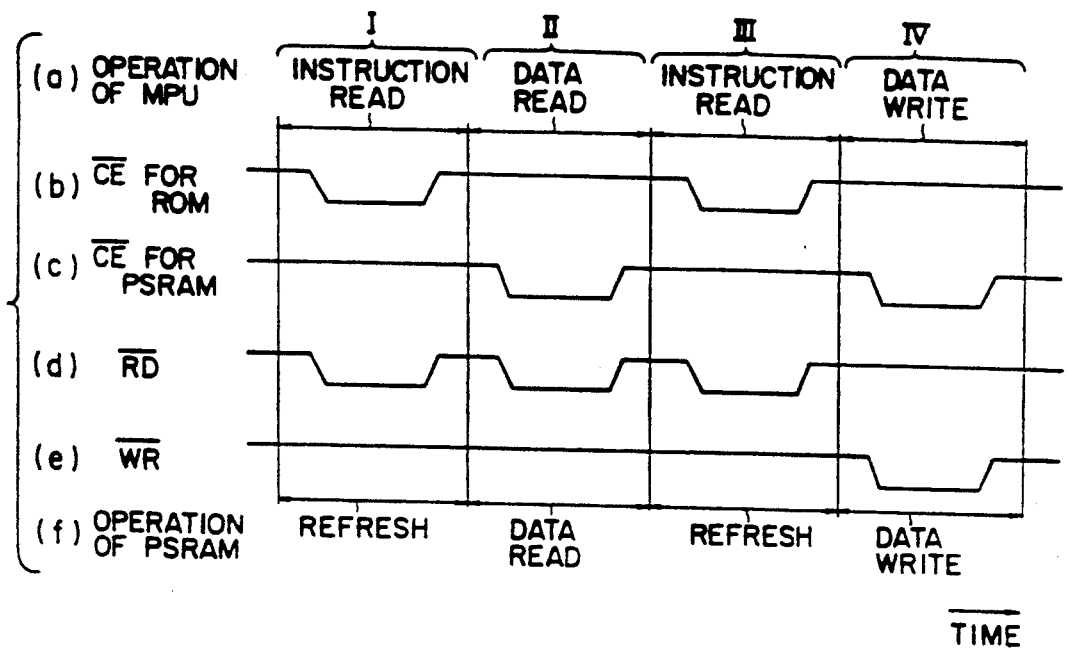
F I G. 9

REFRESH CONTROL CIRCUIT OF PSEUDO STATIC RANDOM ACCESS MEMORY AND PSEUDO STATIC RANDOM ACCESS MEMORY APPARATUS

This application is a continuation of application Ser. No. 07/375,856, filed Jul. 6, 1989, U.S. Pat. No. 5,075,886.

FIELD OF THE INVENTION

The present invention relates to a refresh control circuit used for refreshing a pseudo static random access memory, and a pseudo static random access memory apparatus using the refresh control circuit.

BACKGROUND OF THE INVENTION

A pseudo static random access memory (PSRAM) has been developed recently, and the demand for PSRAMs is becoming extensive. A PSRAM uses as its memory cell a dynamic type memory cell constructed of one transistor and one capacitor used in a dynamic random access memory (DRAM), and uses as its peripheral circuit a peripheral circuit used in a static random access memory (SRAM). By virtue of such a circuit arrangement, a PSRAM has both the characteristics of DRAMs and SRAMs, i.e., the low cost and large capacity of a DRAM and the ease of use of a SRAM.

As described above, a PSRAM uses a dynamic memory cell the same as that of a DRAM. Therefore, a refresh operation is required to hold data stored in this memory cell. In order to facilitate refresh operation control, a memory device is provided with a refresh control terminal RFSH. By using a refresh signal, the PSRAMs now available on the market are refreshed while they are not being accessed.

In a computer system (PSRAM apparatus) as shown in FIG. 8, a PSRAM 1 is used for data read/write, and an instruction read from a ROM 2 is executed by a microprocessor unit MPU 3. In such a system, while an instruction is read from ROM 2, PSRAM 1 is not accessed for data read/write operation. Consequently, a refresh operation is performed while the instruction is read.

FIG. 9 shows an example of the operation of the system shown in FIG. 8. In this operation, MPU 3 executes an instruction read from ROM 2 (cycle I), a data read from PSRAM 1 (cycle II), an instruction read from ROM 2 (cycle III), and a data write to PSRAM 1 (cycle IV). In this case, a period longer than half the operation time is consumed for reading ROM 2. Therefore, if the instructin read cycles I and III are used as the refresh cycles of PSRAM 1, it is easy to refresh all the memory cells in a PSRAM within a certain period. FIGS. 9(b) to 9(e) show the level change of signals supplied from MPU 3 and a decoder 4 to the associated terminals of PSRAM 1 and ROM 2. Upon application of the signals having such level change to the associated terminals, the above-described operations of MPU 3 and PSRAM 1 are carried out during the respective cycles I to IV. FIG. 9(b) and 9(c) show the signals supplied from the decoder 4 to CE terminals of ROM 2 and PSRAM 1. FIG. 9(d) shows the signal supplied from a $\overline{RD}$ terminal of MPU 3 to an $\overline{OE/RFSH}$ terminal of PSRAM 1 and to an $\overline{OE}$ terminal of ROM 2. FIG. 9(e) shows the signal supplied from a $\overline{WR}$ terminal of MPU 3 to a R/W terminal of PSRAM 1.

However, a refresh operation control as described above becomes practically impossible for a system in which a ROM is not used but instructions and data are stored in the common PSRAM, for sound systems for which the operating speed is slow, or for certain systems handling image information. In order to allow refresh operation control for such systems, the following various circuit elements are required: namely, a timer for supervising the timing when a refresh operation becomes necessary, an arbitrator circuit for determining the priority order for the case where a PSRAM refresh operation and an access operation conflict with each other, a circuit for causing the system to enter into a standby state during a refresh operation, and other circuits. The system accordingly becomes complicated, and the characteristics of low cost and facility of PSRAMs are hindered.

SUMMARY OF THE INVENTION

The present invention has been made in consideration of the above problems. It is therefore an object of the present invention to provide a refresh control circuit capable of refreshing PSRAMs and to provide a pseudo static random access memory apparatus by using a simple circuit arrangement. According to the present invention, a memory request signal from control means such as an MPU is delayed by a delay circuit and outputted as a chip enable signal for a PSRAM.

As the memory request signal changes its level from a selection level to a non-selection level, a refresh control signal outputted from a refresh control signal output circuit also changes its level. In other words, as the memory request signal changes its level from the selection level to the non-selection level, the refresh control signal changes its level to a non-refresh level. This state is maintained for a predetermined period. After the chip enable signal changes its level from the selection level to the non-selection level, the refresh control signal returns from the non-refresh level to the refresh level. Thus, the PSRAM enters into the refresh state during the non-selection state, and is refreshed. This refresh operation is necessarily performed after an access to the PSRAM.

According to the present invention, a PSRAM refresh operation is necessarily performed after a PSRAM access so that other circuits for refreshing the PSRAM are not needed, thus realizing a system of simple structure and low cost.

BRIEF DESCRIPTION OF THE DRAWINGS

FIG. 1 is a block diagram showing an embodiment of a refresh control circuit according to the present invention;

FIG. 2 is a timing chart showing the operation of the refresh control circuit;

FIG. 3 is a circuit diagram showing a particular example of the refresh control circuit;

FIG. 6, 6A, 7 and 7A are block diagrams showing embodiments of pseudo static random access memory apparatus according to the present invention;

FIG. 8 is a block diagram showing a pseudo static random access memory apparatus according to the related background art; and FIG. 9 is a timing chart showing the operation of the apparatus shown in FIG. 8.

DESCRIPTION OF THE PREFERRED EMBODIMENTS

Figure 4:
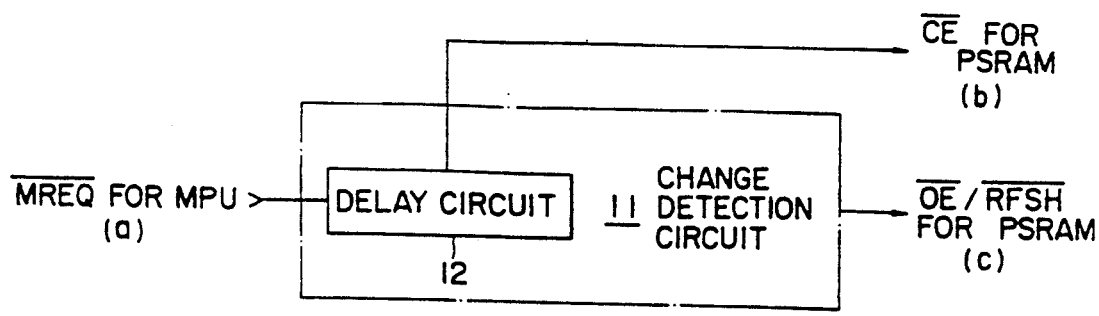
FIG. 4 is a block diagram showing another embodiment of the refresh control circuit.

FIGS. 1 and 2 are a block diagram and timing chart of a refresh control circuit according to an embodiment of this invention. A memory request signal $\overline{MREQ}$ shown in FIG. 2(a) from an MPU is inputted to a change detection circuit (refresh control signal output circuit) and a delay circuit 12 in parallel. The change detection circuit 11 outputs a signal as shown in FIG. 2(c) which operates as an output-control/refresh-control signal OE/RFSH. The delay circuit 12 outputs a signal as shown in FIG. 2(b) which operates as a chip enable signal $\overline{CE}$ of a PSRAM. The following relationship stands for the signals shown in FIGS. 2(a) to 2(c). Namely, the signal MREQ shown in FIG. 2(a) delayed by a predetermined time is the signal CE shown in FIG. 2(b). As the signal MREQ shown in FIG. 2(a) changes its level from high (H) to how (L) or from L to H, the signal OE/RFSH shown in FIG. 2(c) changes from L to H, and after the lapse of a predetermined time, returns to L.

The operation of the circuit shown in FIG. 1 will be described in more detail with reference to FIG. 2. As the level of the signal $\overline{MREQ}$ sown in FIG. 2(a) and supplied from MPU changes from H to L at time t0, the signal OE/RFSH of PSRAM shown in FIG. 2(c) changes its level from L to H at time t1, and thereafter changes its level from H to L at time t3. At time t2 between times t1 and t3, the signal CE of PSRAM shown in FIG. 2(b) changes its level from H to L. Then, during the selection state of PSRAM at time t3, the signal OE/RFSH changes its level from H to L, so the read or write operation for PSRAM is carried out. Specifically, if a write signal WR is supplied from MPU, a write operation is carried out, whereas if not, a read operation is carried out.

As the signal $\overline{MREQ}$ shown in FIG. 2(a) and supplied from MPU changes its level from L to H at time t4, the signal OE/RFSH of PSRAM shown in FIG. 2(c) changes its level from L to H at time 55, and thereafter at time t7 changes its level from H to L. At time t6 between times t5 and t7, the signal CE of PSRAM shown in FIG. 2(b) changes its level from L to H. Then, during a non-selection state of PSRAM at time t7, the signal OE/RFSH changes its level from H to L, so as refresh operation of PSRAM is carried out. As can be understood from the above circuit operation, each time PSRAM is accessed, a refresh operation is necessarily performed after the access. Therefore, an additional refresh control circuit is not needed if the circuit shown in FIG. 2 is used.

FIG. 3 shows a particular example of the circuit shown in FIG. 1. The signal $\overline{MREQ}$ from MPU is applied via an inverter $I_1$ to a delay circuit 15 constructed of a resistor R1 and capacitor C1. An output from the delay circuit 15 is applied to an inverter $I_2$ whose output is applied to a delay circuit 16 constructed of a resistor R2 and capacitor C2. An output from the delay circuit 16 is applied via an inverter $I_3$ to one input terminals of an OR and NAND I. The other input terminals of the OR and NAND I have the signal $\overline{MREQ}$ from MPU applied. The outputs from the OR and NAND I are applied to an NAND II from which the signal OE/RFSH for the PSRAM is derived. The OR, NAND I and NAND II constitute an EX-NOR so that the three elements may be replaced with a single EX-NOR.

Figure 5:
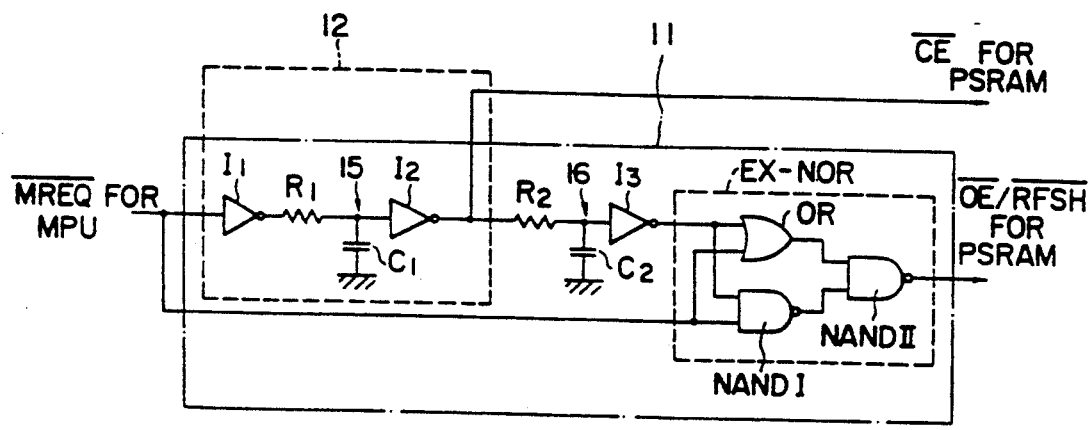
FIG. 5 is a circuit diagram showing a particular example of the refresh control circuit shown in FIG. 4.

FIG. 4 shows a modification to the circuit shown in FIG. 1. The control circuit shown in FIG. 1 is made of two separate blocks of the change detection circuit 11 and the delay circuit 12. In contrast, in FIG. 4, some of the constituting elements of the change detection circuit 11 are used as the delay circuit 12. Since some of the constituting elements are used in common for both circuits, the number of total constituting elements of the control circuit can be reduced. The particular example of the control circuit of FIG. 4 is shown in FIG. 5. The circuit arrangement shown in FIG. 5 is the same as the change detection circuit 11 shown in FIG. 3 except that the signal $\overline{CE}$ of PSRAM is picked up at an intermediate point of the circuit.

FIG. 6 shows another embodiment wherein the refresh control circuit used is the same as shown in FIG. 1, and a single PSRAM is used. As seen from FIG. 6, a memory request signal $\overline{MREQ}$ from an MPU 3 serving as a control device is supplied to the change detection circuit 11 and delay circuit 12 in parallel, which are respectively shown in FIG. 1 and constitute the refresh control circuit 13. An output from the change detection circuit 11 is applied to an output-control/refresh-control terminal $\overline{OE/RFSH}$ of a PSRAM 1a. An output from the delay circuit 12 is applied to chip enable terminal $\overline{CE}$ of PSRAM 1a. The rest of the circuit arrangement is the same as shown in FIG. 8. Namely, data terminals (Data) of MPU 3 are connected to data terminal D0 to D7 of PSRAM 1a, and address terminals (Add) of MPU 3 are connected to address terminals (Add) of PSRAM 1a. In the operation of the control circuit shown in FIG. 6, as the signal $\overline{MREQ}$ from MPU 3 changes its level as shown in FIG. 2(a), the signal shown in FIG. 2(c) is applied from the change detection circuit 11 to the terminal $\overline{OE/RFSH}$ of PSRAM 1a, and the signal shown in FIG. 2(b) is applied from the delay circuit 12 to the terminal $\overline{CE}$ of PSRAM 1a.

Figure 7:
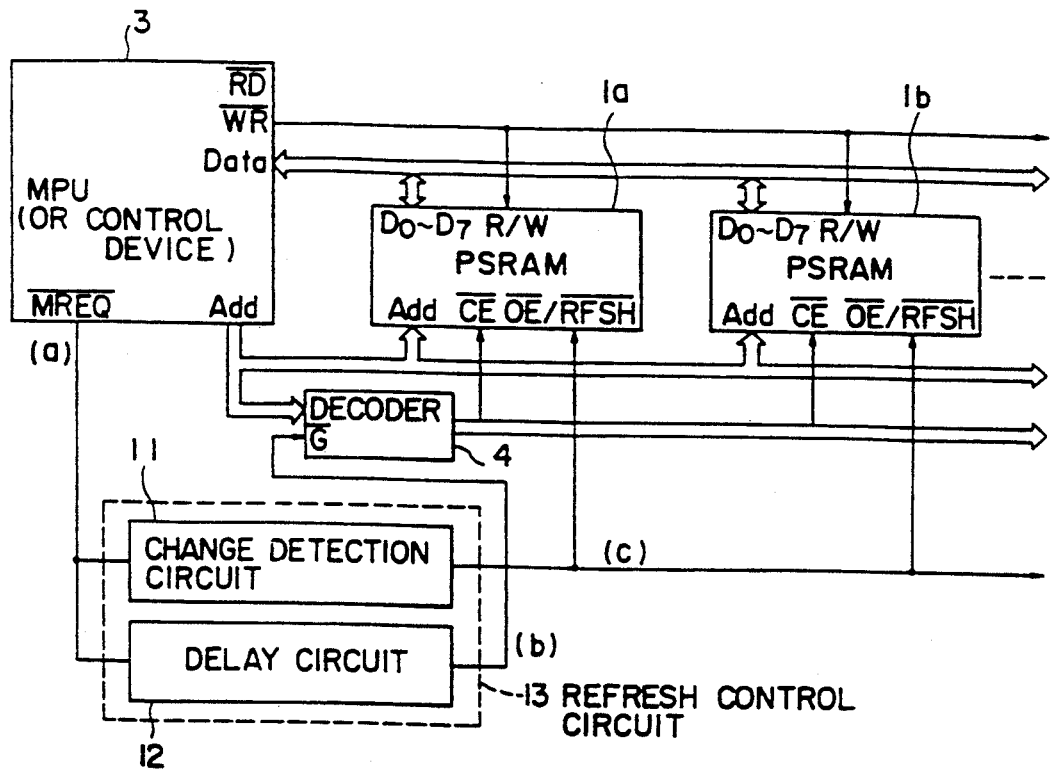

FIG. 7 shows another embodiment wherein a plurality of PSRAMs 1a, 1b, . . . are used. The difference of the circuit shown in FIG. 7 from that shown in FIG. 6 resides in that there is provided a decoder for selecting one of the plurality of PSRAMs 1a, 1b, . . . An output from the delay circuit 12 is applied to a terminal $\overline{G}$ of the decoder, and an output from the decoder 4 is applied to a chip enable terminal $\overline{CE}$ of each PSRAM 1a, 1b, . . . The decoder 4 starts operating upon reception of an output from the delay circuit 13 at the terminal $\overline{G}$, and decodes an address signal (Add) from MPU 3 to thereby select one of the PSRAMs 1a, 1b, . . . The selected PSRAM is refreshed after the access thereto, in a manner similar to that shown in FIG. 2. The other non-selected PSRAMs are refreshed twice when the selected PSRAM is accessed and refreshed.

It is obvious that only one refresh control circuit 13 is required irrespective of the number of PSRAMs 1a, 1b, . . . to be connected in FIG. 7.

Figure 7A:
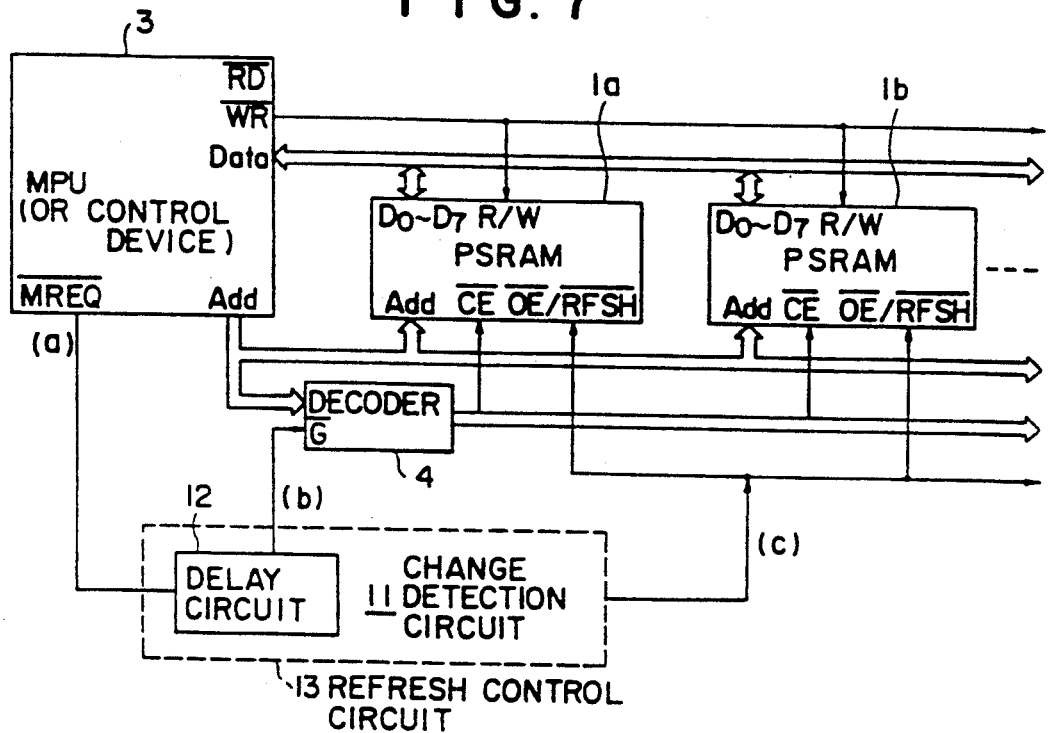

The embodiments shown in FIGS. 6A and 7A use the refresh control circuit shown in FIG. 4, whereas the embodiments shown in FIGS. 6 and 7 use the refresh control circuit shown in FIG. 1 as described above.

The embodiments in the foregoing description have the following advantages. Namely, a refresh control for PSRAM can be effected with a relatively simple circuit as shown in FIG. 1 or 4. Therefore, it is not necessary to provide a timer for detecting the timing of refresh operation, a circuit for controlling the priority order for the case where a refresh request issued from the timer conflicts with an access request from MPU, and other circuits, to thereby simplify the system. Furthermore, by using the circuit shown in FIG. 1 or 4, it becomes unnecessary to pay attention to the refresh control itself, thus allowing the use of PSRAMs in a manner similar to SRAMs. Consequently, the system design is facilitated and the system can be simplified.

What is claimed is:

1. A refresh control circuit for controlling a pseudo static random access memory cell, comprising:

control means for providing a memory request signal which alternatively changes between a selection level and a non selection level;

a delay circuit for receiving said memory request signal, delaying said memory request signal by a predetermined delay time and outputting a delay memory request signal as a chip enable signal having a level change between a selection level and a non-selection level; and a refresh control signal output circuit for receiving said memory request signal and for outputting a refresh control signal, and said refresh control signal output circuit responding to the level change of said memory request signal between said selection level and said non-selection level for changing said refresh control signal from a first level to a second level at a first predetermined time lapse after said level change of said memory request signal between said selection level and said non-selection level has occurred and thereafter changing said refresh control signal from said second level to said first level at a second predetermined time lapse, and wherein said level of said refresh control signal changes from said second level to said first level after said level of said chip enable signal changes between said selection level said non-selection level, said pseudo static random access memory cell changes to write mode when said chip enable signal take said selection level, said refresh control signal takes said selection level, said refresh control signal takes said first level and said signal is outputted from said control means, said refresh control signal changing to a read mode when said chip enable signal takes said selection level, said refresh control signal takes first level and said write signal is prevented from being outputted from said control means, and changes to a refresh mode when said chip enable signal takes said non-selection level and said refresh control signal further takes said second level whether or not said write signal is being outputted from said control means.

2. A pseudo static random access memory apparatus, comprising:

a control device;

only one pseudo static random access memory cell;

an address bus, a data bus and a write signal line each respectively coupling said control device to said pseudo static random access memory cell;

a refresh control circuit;

a memory request signal lien coupling said control deice to said refresh control circuit; and a chip enable signal line and a refresh control signal line, each respectively coupling said refresh control circuit to said pseudo static random access memory cell, wherein said control deice supplies a memory request signal, having levels which alternatively change between a selection level and a non-selection level, to said refresh control circuit, supplying an address signal, which designates at least one memory cell in said pseudo static random access memory, to said pseudo static random access memory cell and supplying a write signal for changing an operating mode of said pseudo static random access memory cell to a write mode to said pseudo static random access memory cell, and said refresh control circuit comprising:

a delay circuit for delaying said memory request signal by a predetermined time delay to produce a delayed memory request signal and for supplying said delayed memory request signal to said pseudo static random access memory cell as a chip enable signal, said chip enable signal having a level change between a selection level and a non-selection level, and a refresh control signal output circuit for supplying a refresh control signal to said pseudo static random access memory cell, said refresh control signal output circuit changing levels of said refresh control signal on the basis of level changing of said memory request signal changing between said selection level and said non-selection level, said refresh control signal output circuit changing said refresh control signal from a first level to a second level at a predetermined time lapse after said memory request signal changes between said selection level and said non-selection level, and thereafter said refresh control signal output circuit changing said refresh control signal from said second level to said first level after level changing of said chip enable signal between said selection level and said non-selection level, said pseudo static random access memory cell changing to a write mode when said chip enable signal takes said selectional level, said refresh control signal takes said first level and said write signal is outputted from said control device, changing to a read more when said chip enable signal takes said selection level, said refresh control signal takes said first level and said write signal is not outputted from said control device, and changing to a refresh mode when said chip enable signal takes said non-selection level and said refresh control signal takes said second level whether or not said write signal is being outputted from said control device.

3. A refresh control circuit according to claim 1, wherein said refresh control signal output circuit and said delay circuit are coupled in parallel for receiving said memory request signal.

4. A refresh control circuit according to claim 3, wherein, said refresh control signal output circuit comprises a first serial circuit including, in order, a first inverter, a first RC delay circuit, a second inverter, a second RC delay circuit, a third inverter and an exclusive NOR circuit and said delay circuit comprises a second serial circuit including, in order, a first inverter, an RC delay circuit and a second inverter.

5. A refresh control circuit according to claim 1, wherein said refresh control signal output circuit includes said delay circuit.

6. A refresh control circuit according to claim 5, wherein, said refresh control signal output circuit comprises a first serial circuit including, in order, a first inverter, a first RC delay circuit, a second inverter, a second RC delay circuit, a third inverter and an exclusive NOR circuit and said delay circuit comprises a second serial circuit including said first inverter, said first RC delay circuit and said second inverter of said refresh control signal output circuit.

7. A pseudo static random access memory apparatus according to claim 2, wherein said refresh control signal output circuit and said delay circuit have respective inputs coupled in parallel to receive said memory request signal.

8. A pseudo static random access memory apparatus according to claim 7, wherein said refresh control signal put circuit comprise a first serial circuit including, in order, a first inverter, a first RC delay circuit, a second inverter, a second RC delay circuit, a third inverter and an exclusive NOR circuit and said delay circuit comprises a second serial circuit including, in order, a first inverter, an RC delay circuit and a second inverter.

9. A pseudo static random access memory apparatus according to claim, wherein said refresh control signal output circuit includes said delay circuit.

10. A pseudo static random access memory apparatus according to claim 9, wherein said refresh control signal output circuit comprises a first serial circuit including, in order, a first inverter, a first RC delay circuit, a second inverter, a second RC delay circuit, a third inverter and an exclusive NOR circuit and said delay circuit comprise a second serial circuit including said first inverter, said first RC delay circuit and said second inverter of said refresh control signal output circuit.

* * * * *